United States Patent
Ahn et al.

(10) Patent No.: US 7,099,181 B2
(45) Date of Patent: Aug. 29, 2006

(54) NON-VOLATILE DYNAMIC RANDOM ACCESS MEMORY

(75) Inventors: Jin-Hong Ahn, Ichon-shi (KR); Sang-Hoon Hong, Ichon-shi (KR); Young-June Park, Ichon-shi (KR); Sang-Don Lee, Ichon-shi (KR); Yil-Wook Kim, Ichon-shi (KR); Gi-Hyun Bae, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/749,297

(22) Filed: Dec. 31, 2003

(65) Prior Publication Data

US 2005/0047194 A1    Mar. 3, 2005

(30) Foreign Application Priority Data

Aug. 29, 2003  (KR) .................. 10-2003-0060343

(51) Int. Cl.
*G11C 11/24* (2006.01)

(52) U.S. Cl. ............. 365/149; 365/185.01; 365/184.24

(58) Field of Classification Search ................ 365/149, 365/145, 185.01, 185.24, 185.25, 185.26, 365/185.33, 185.08
See application file for complete search history.

(56) References Cited

U.S. PATENT DOCUMENTS

| | | | | |
|---|---|---|---|---|
| 4,446,536 | A  * | 5/1984 | Rodgers | 365/185.23 |
| 5,455,786 | A  * | 10/1995 | Takeuchi et al. | 365/145 |
| 5,703,804 | A  * | 12/1997 | Takata et al. | 365/145 |
| 5,712,817 | A  * | 1/1998 | Suh | 365/185.08 |
| 6,009,011 | A  * | 12/1999 | Yamauchi | 365/185.01 |
| 6,141,248 | A  * | 10/2000 | Forbes et al. | 365/185.08 |
| 6,314,017 | B1 * | 11/2001 | Emori et al. | 365/149 |
| 6,674,667 | B1 * | 1/2004 | Forbes | 365/185.24 |
| 6,714,474 | B1 * | 3/2004 | Nanba | 365/226 |
| 6,829,166 | B1 * | 12/2004 | Lin et al. | 365/185.18 |

* cited by examiner

*Primary Examiner*—Tuan T. Nguyen
*Assistant Examiner*—Dang Nguyen
(74) *Attorney, Agent, or Firm*—Blakely Sokoloff Taylor & Zafman

(57) ABSTRACT

A method for operating a non-volatile dynamic random access memory (NVDRAM) device having a plurality of memory cells, each cell having a capacitor and a transistor having a floating gate includes the steps of (A) preparing a power-on mode for performing a DRAM operation; and (B) preparing a power-off mode for holding stored data in the memory cell.

32 Claims, 14 Drawing Sheets

WHEN FLOATING GATE STORES '1'

WHEN FLOATING GATE STORES '0'

<WHEN THRESHOLD VOLTAGE IS HIGHER THAN $V_{Hth}$>

<WHEN THRESHOLD VOLTAGE IS $V_{Hth}$>

<WHEN THRESHOLD VOLTAGE IS HIGHER THAN $V_{Hth}$>

<THRESHOLD VOLTAGE IS DECREASED>

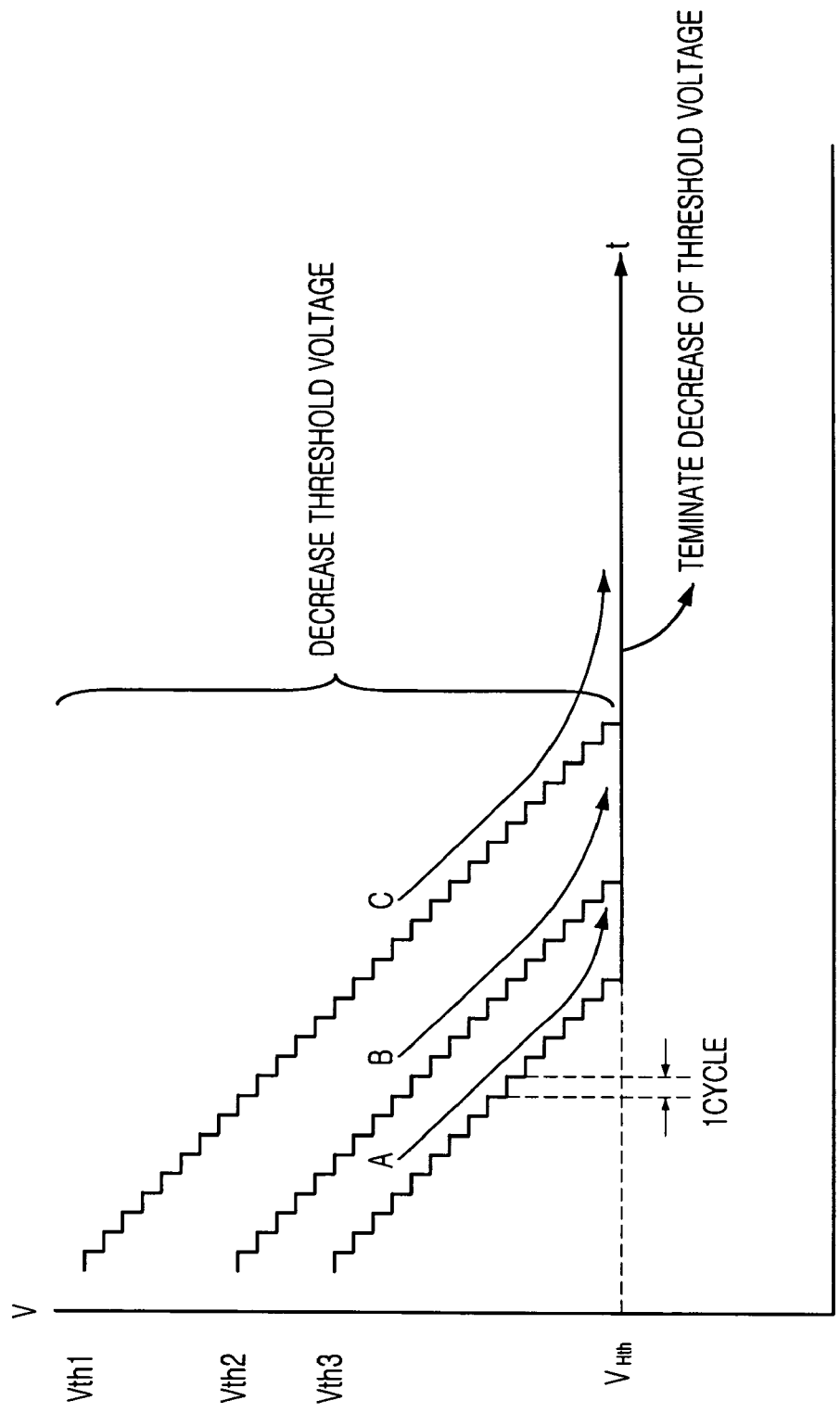

<WHEN THRESHOLD VOLTAGE IS HIGHER THAN $V_{Hth}$>

<THRESHOLD VOLTAGE IS DECREASED>

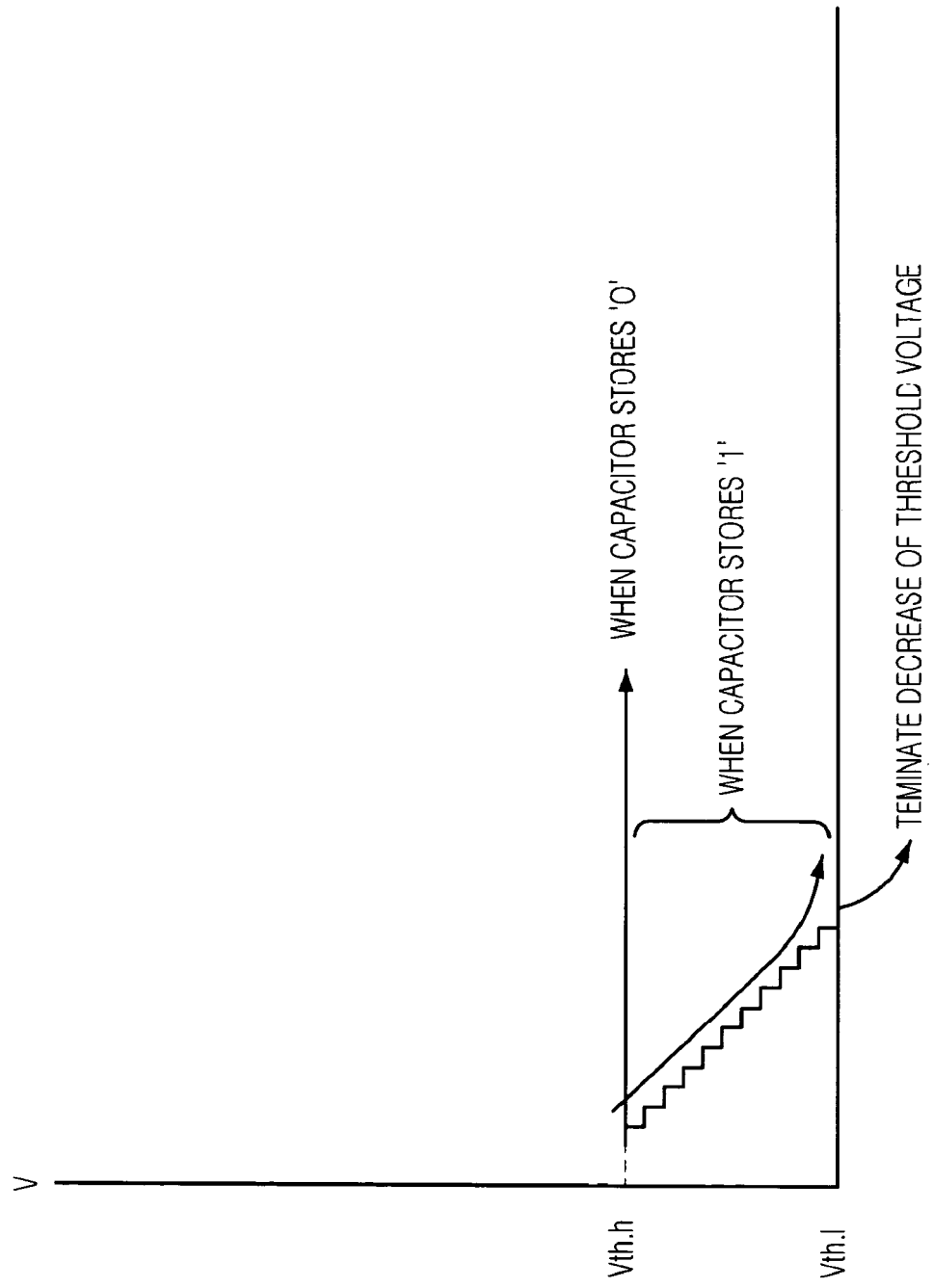

NON-VOLATILE DYNAMIC RANDOM ACCESS MEMORY

FIELD OF INVENTION

The present invention relates to a semiconductor memory device; and, more particularly, to a non-volatile dynamic random access memory (NVDRAM) device and an operation method of the same.

DESCRIPTION OF PRIOR ART

In general, a semiconductor memory device can be classified into a random access memory (hereinafter, referred as RAM) and a read only memory (hereinafter, referred as ROM). The RAM is volatile, where as the ROM is non-volatile. Namely, the ROM can keep stored data even though power supply is removed, but the RAM cannot keep stored data if the power supply is removed.

A plurality of RAMs, which take advantage of the ability of field effect transistors to store charge, have evolved and thus serve as memory cells. Such cells may be either dynamic or static in nature. As well know, the dynamic cells may employ only a single field effect transistor and the static cells may be arranged in a flip-flop configuration. These types of the cells may be referred to as volatile cells since information stored in these cells is lost when the power supply voltage applied to the memory is lost or turned off. In instances where stored volatile information must be retained, an alternate power supply, such as a battery system, must be coupled to the memory for use in the event of failure of the main power supply.

FIG. 1A is a schematic diagram showing a dynamic cell in a conventional volatile dynamic RAM device; and FIG. 1B is a cross-sectional view describing a metal oxide semiconductor (MOS) transistor in the dynamic cell shown in FIG. 1A.

As shown, a capacitor Cap is used for storing data, i.e., logic high or low data '1' or '0'. When a MOS transistor MOS is turned on by a word line voltage Vg, the capacitor Cap is charged or discharged in response to a bit line voltage Vb1. If the bit line voltage Vb1 is in logic high, the capacitor Cap is charged, i.e., stores '1'. If otherwise, the capacitor Cap is discharged, i.e., stores '0'. Herein, a plate line of the capacitor Cap is supplied with a plate line voltage Vcp. In general, the plate line voltage Vcp is 0 V or a half of the supply voltage.

Meanwhile, in order to hold information without the alternate power supply, known devices capable of providing variable threshold voltages, such as field effect transistors having metal-nitride-oxide-silicon (MNOS) and field effect transistors having a floating gate, are also capable of storing information in a non-volatile manner for long periods. By incorporating such non-volatile devices into memory cells, there have been provided normally operating volatile cells which do not require a backup or an alternate power supply for preserving information when a power interruption or failure occurs in the main power supply.

The non-volatile memory cells which use non-volatile MNOS transistors or relevant devices are capable of retaining information stored volatilely in a cell for moderate periods of time. However, these devices require high voltage pulses for writing and erasing the information.

FIG. 2 is a cross-sectional view describing a conventional non-volatile dynamic cell which uses a floating gate device. As shown, the conventional non-volatile dynamic cell has a gate stack 24 to 21. The gate stack includes a control gate 24, a first insulting layer 23, a floating gate 22 and a second insulating layer 21. Hereinafter, referring to U.S. patents, the conventional non-volatile dynamic cell will be described in detail.

For example, commonly assigned U.S. Pat. No. 3,916,390, issued on Oct. 28, 1975 to J. J. Chang and R. A. Kenyon and entitled "DYNAMIC MEMORY WITH NON-VOLATILE BACK-UP MODE", discloses the use of a dual insulator made of silicon dioxide and silicon nitride for storing information non-volatilely during power failure. Other examples of the dynamic cells capable of storing information non-volatilely by using MNOS structures include U.S. Pat. No. 4,055,837, issued on Oct. 25, 1977 to K. U. Stein et al and entitled "DYNAMIC SINGLE-TRANSISTOR MEMORY ELEMENT FOR RELATIVELY PERMANENT MEMORIES", and U.S. Pat. No. 4,175,291, issued on Nov. 20, 1979 to W. Spence and entitled "NON-VOLATILE RANDOM ACCESS MEMORY CELL". These dynamic cells having non-volatile capability can operate satisfactorily. However, they generally require larger cell areas, larger voltages for a volatile operating mode or backup memory.

In U.S. Pat. No. 4,471,471, issued on Sep. 11, 1984 to DiMaria and Donelli J. and entitled "NON-VOLATILE RAM DEVICE", there is provided a non-volatile dynamic random access memory (NVDRAM) having a multiplicity of floating gate in a field effect transistor DRAM characterized by a non-volatile memory. The NVDRAM uses the floating gate for storing information non-volatilely during a power failure and utilizes a double electron injector structure (DEIS) stack over the transfer gate for data recovery after resumption of power. A main disadvantage of this cell is that data cannot be transferred from a capacitor to a floating gate in parallel in all cells since the DEIS stack is located on the bit line side of the cell. The data first has to be read out by turning on the transfer transistor and sensing a voltage supplied on the bit line.

For solving the above disadvantage, U.S. Pat. No. 5,331,188, issued on Jul. 19, 1994 to Acovic et al. and entitled "NON-VOLATILE DRAM CELL", discloses a compact one-transistor non-volatile DRAM cell and a method for fabricating same. In the Acovic et al., the DRAM cell has a tunnel oxide or dual electron injector structure disposed between a storage node and a floating gate for non-volatile data retention during power interruptions in a compact one transistor structure.

However, a plate line voltage of a capacitor in the above DRAM cell is coupled to a ground voltage. An electric field of the capacitor is generated by only a voltage supplied to a word line and a bit line. Therefore, the floating gate should include two layers and the size of the DRAM cell should be increased. Also, a method and process for fabricating the DRAM cell may be more complex. In comparison with a DRAM cell of which a plate line voltage can be adjusted, the NVDRAM may consume larger power because the word line and the bit line should be supplied with a relatively high voltage.

SUMMARY OF INVENTION

It is, therefore, an object of the present invention to provide a non-volatile dynamic random access memory (NVDRAM) device which can operate in high speed and have a DRAM cell of which a plate line voltage can be adjusted.

In accordance with an aspect of the present invention, there is provided a method for operating a non-volatile dynamic random access memory (NVDRAM) device having a plurality of memory cells, each cell having a capacitor and a transistor having a floating gate includes the steps of (A) preparing a power-on mode for performing a DRAM operation; and (B) preparing a power-off mode for holding stored data in the memory cell.

In accordance with another aspect of the present invention, there is provided a non-volatile dynamic random access memory (NVDRAM) device including a plurality of memory cells, wherein each memory cell includes a control gate layer coupled to a word line; a capacitor for storing data; a floating transistor for transmitting stored data in the capacitor to a bit line; and a first insulating layer between the control gate layer and the gate of the floating transistor, wherein one side of the capacitor is coupled to a drain of the floating transistor and the other of the same is supplied with each different voltage in response to the operation mode.

In accordance with another aspect of the present invention, there is provided a non-volatile dynamic random access memory (NVDRAM) device including a plurality of memory cells, wherein each memory cell includes a control gate layer coupled to a word line; a capacitor for storing data; and a floating transistor for transmitting stored data in the capacitor to a bit line, wherein one side of the capacitor is coupled to a drain of the floating transistor and the other of the same is supplied with each different voltage in response to the operation mode.

BRIEF DESCRIPTION OF THE DRAWINGS

The above and other objects and features of the instant invention will become apparent from the following description of preferred embodiments taken in conjunction with the accompanying drawings, in which:

FIG. 5E is a graph demonstrating the normalization mode of the NVDRAM shown in FIG. 3;

FIG. 7C is a graph demonstrating the program mode of the NVDRAM shown in FIG. 3;

DETAILED DESCRIPTION OF INVENTION

Hereinafter, a non-volatile dynamic random access memory (NVDRAM) device and a driving method thereof will be described in detail with reference to the accompanying drawings.

Figure 1A:
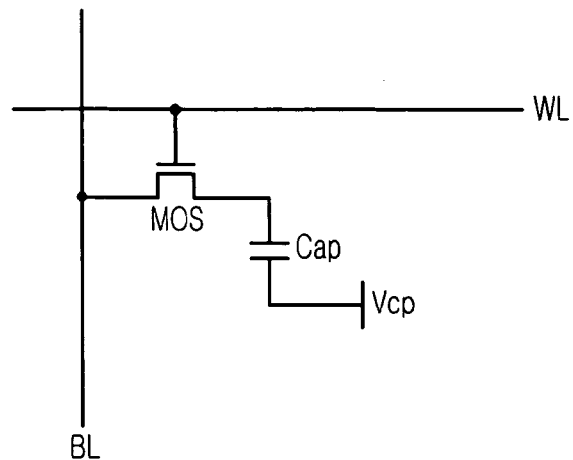
FIG. 1A is a schematic diagram showing a dynamic cell in a conventional volatile dynamic random access memory (RAM) device.
Figure 1B:
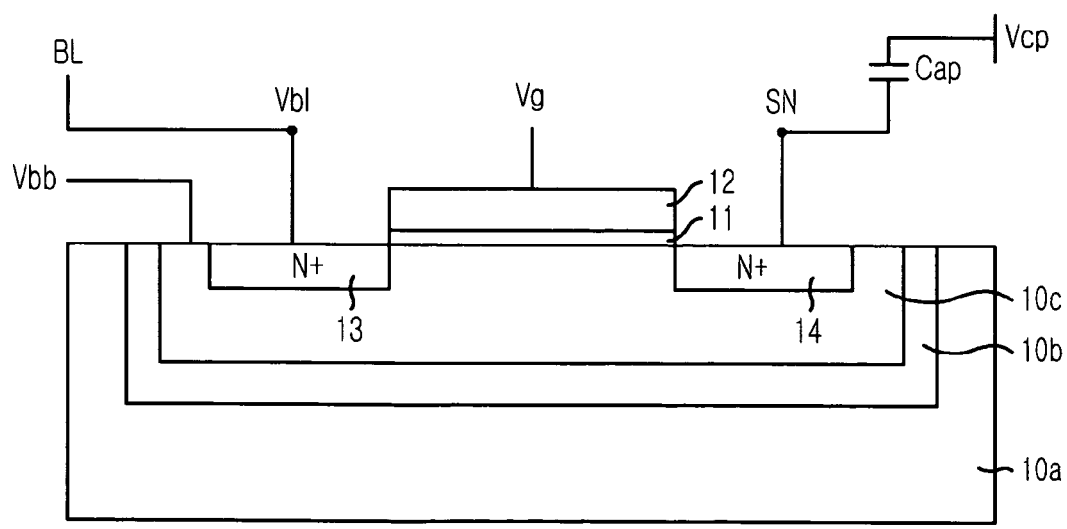
FIG. 1B is a cross-sectional view describing a metal oxide semiconductor (MOS) transistor in the dynamic cell shown in FIG. 1A.
Figure 2:
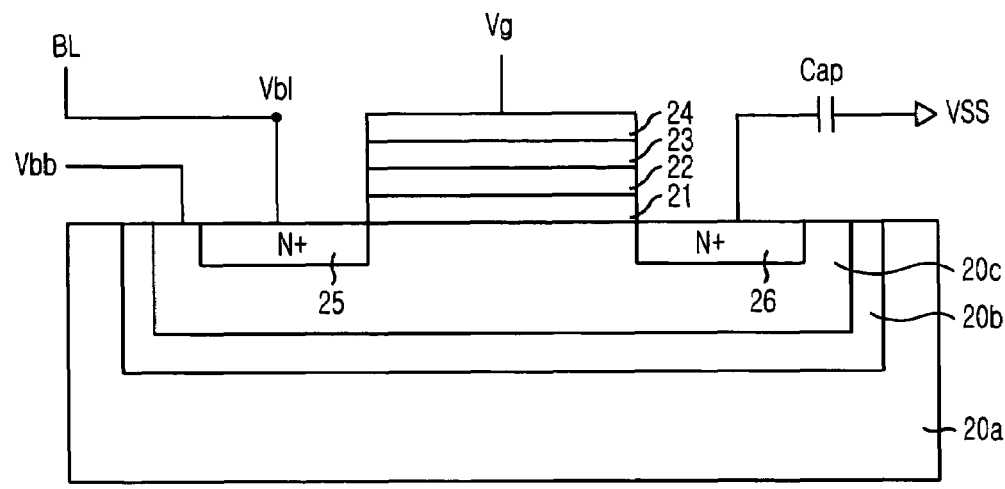
FIG. 2 is a cross-sectional view describing a conventional non-volatile dynamic cell which uses a floating gate device.
Figure 3:
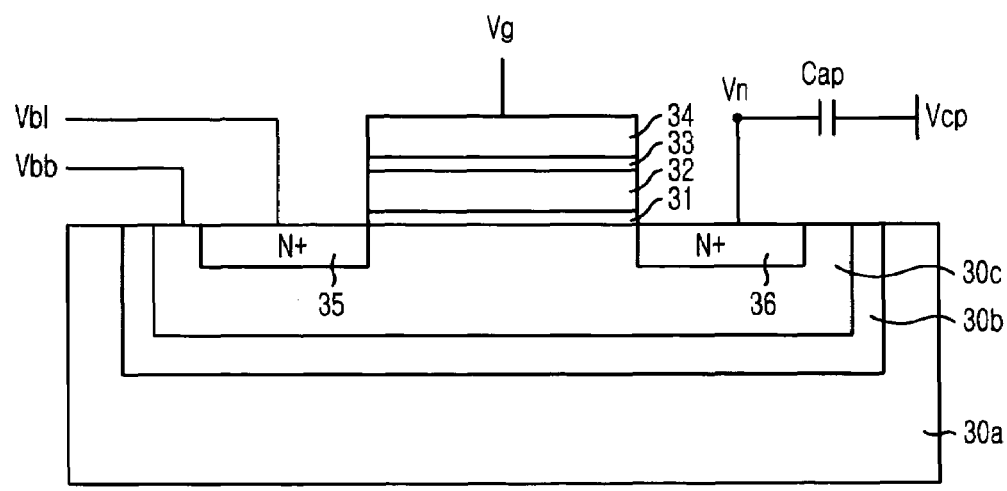
FIG. 3 is a cross-sectional view showing a dynamic cell in a non-volatile dynamic RAM (NVDRAM) device in accordance with a preferred embodiment of the present invention.

FIG. 3 is a cross-sectional view showing a memory cell of a NVDRAM device in accordance with a preferred embodiment of the present invention.

As shown, the memory cell of the NVDRAM device includes a control gate 34, a floating gate 32, first and second insulting layers 33 and 31, a transistor and a capacitor Cap.

Also, a plate line of the capacitor Cap is supplied with a plate line voltage $V_{cp}$, not a ground voltage. That is, because the capacitor Cap is supplied with a controllable plate line voltage $V_{cp}$, the NVDRAM device can be operated by inputting a relatively low voltage at a word line and a bit line coupled to the memory cell. Namely, the NVDRAM device of the present invention can reduce power consumption.

Herein, referring to FIG. 3, if the control gate 34 and the floating gate 32 are made of poly-silicon, the first insulating layer 33 is located between the control gate 34 and the floating gate 32. Namely, the memory cell has a silicon-oxide-nitride-oxide-silicon (SONOS) structure 34 to 31.

Hereinafter, an operation of the NVDRAM including a plurality of the memory cells having the floating gate made of poly-silicon is described in detail.

The NVDRAM device holds data in each cell if an external voltage is isolated; if otherwise, the NVDRAM device operates as a volatile DRAM device. Therefore, the NVDRAM device has four different types of an operational mode: they are, a recall mode, a normalization mode, a DRAM mode and a program mode. Herein, the recall mode and the normalization mode are considered as a power-on mode for performing a DRAM operation; and the program mode is considered as a power-off mode for holding stored data in the memory cell.

The recall mode is a process for delivering data stored in the floating gate 32 to the capacitor Cap when the external voltage starts to be supplied. The normalization mode is for equalizing each threshold voltage of all memory cells by charging the floating gate 32 with the same amount of charges. The DRAM mode means that the NVDRAM device operates as the volatile DRAM device. The program mode is for delivering data stored in the capacitor Cap to the floating gate 32 when the external voltage starts to be isolated. Hereinafter, the four modes of the NVDRAM device in accordance with the present invention are described in detail.

Figure 4A:
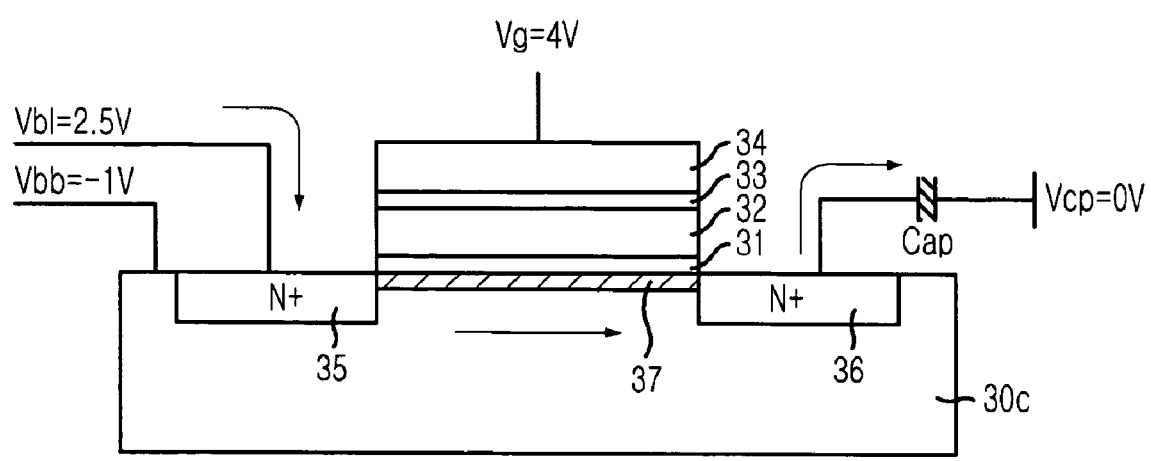
FIGS. 4A to 4C are cross-sectional views depicting a first example of a recall mode of the NVDRAM device shown in FIG. 3.
Figure 4B:
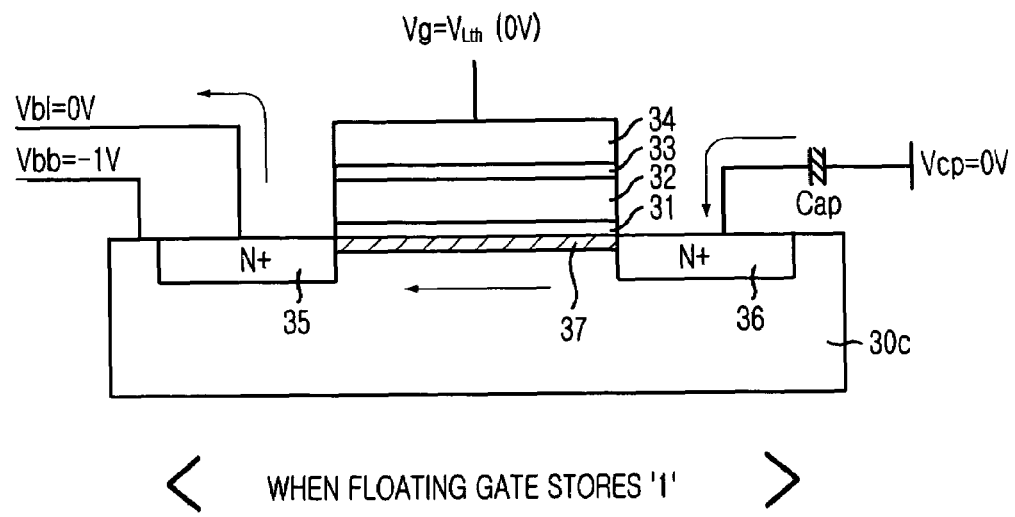
Figure 4B:
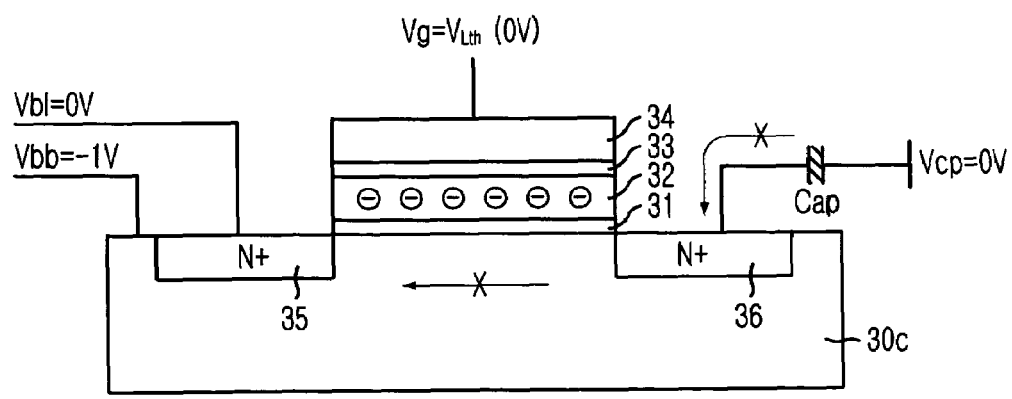
Figure 4C:
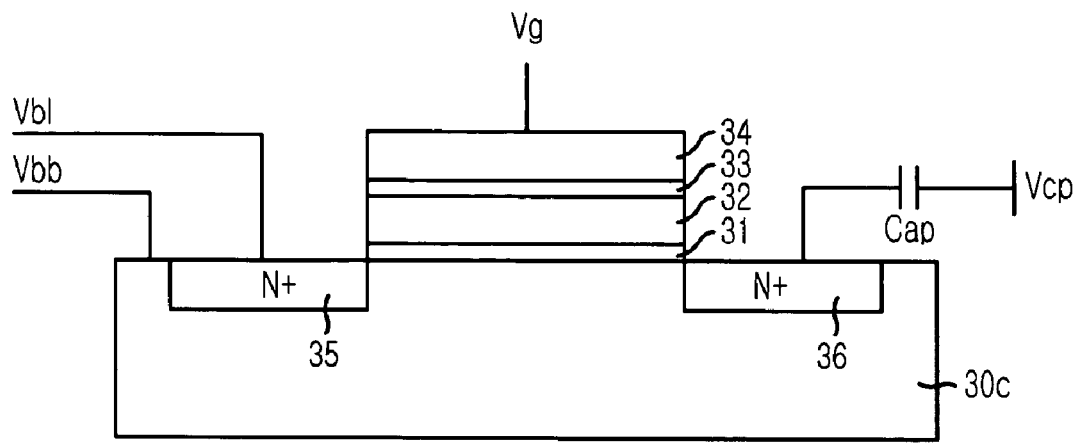
Figure 4C:
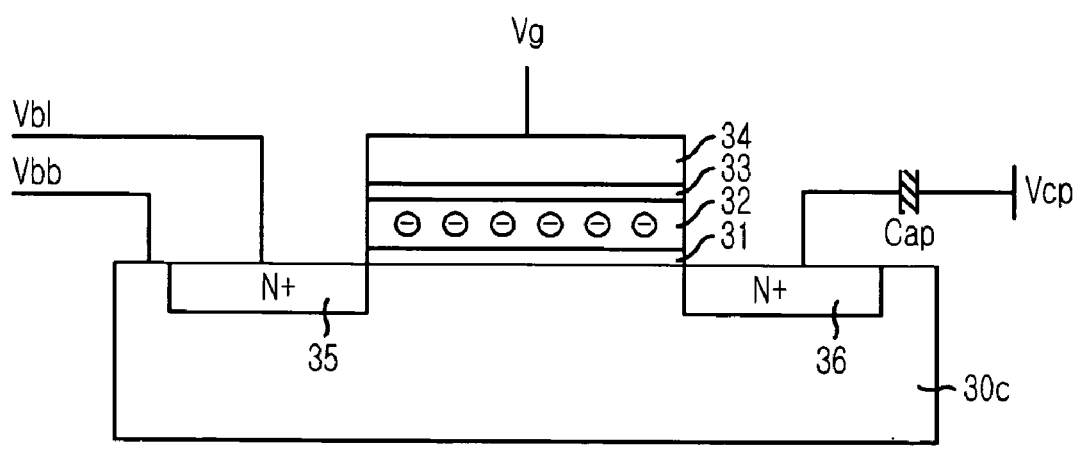

FIGS. 4A to 4C are cross-sectional views depicting a first example of the recall mode of the NVDRAM device shown in FIG. 3.

Namely, in the recall mode, for delivering data stored in the floating gate 32 to the capacitor Cap when the external voltage is supplied, it is checked whether a threshold voltage of each memory cell is a first threshold voltage $V_{Hth}$ or a second threshold voltage $V_{Lth}$ for turning on the transistor. Herein, the first threshold voltage $V_{Hth}$ means that the floating gate has electrons, i.e., stores a logic LOW datum; and the second threshold voltage $V_{Lth}$ means that the floating gate does not have any electron, i.e., stores a logic HIGH datum. That is, the first threshold voltage $V_{Hth}$, e.g., 1 V is higher than the second threshold voltage $V_{Lth}$, e.g., 0 V.

More specifically, as shown in FIG. 4A, gate of each transistor in all of the memory cells is supplied with a higher voltage, e.g., 4V in order to turn on the transistor. Then, all of bit lines are supplied with a supply voltage VDD and, as a result, the logic HIGH datum is written in all of memory cells. That is, the logic HIGH datum is stored in the capacitor Cap of all the memory cells.

Thereafter, referring to FIG. 4B, the gate of each transistor is supplied with the second threshold voltage $V_{Lth}$. Then, in some of the memory cells having the transistor turned on by the second threshold voltage $V_{Lth}$, the capacitor Cap is discharged. However, in the other of the memory cells, i.e., each having the transistor which is not turned on by the second threshold voltage $V_{Lth}$, the capacitor Cap is not discharged.

Namely, if the threshold voltage of the transistor in the memory cell is higher than the second threshold voltage $V_{Lth}$, the capacitor Cap in the same memory cell stores the logic HIGH datum. However, if otherwise, the capacitor Cap stores the logic LOW datum.

Next, all of the memory cells are refreshed. FIG. 4C shows a result of performing the recall mode in the NVDRAM device.

FIGS. 5A to 5D are cross-sectional views depicting the normalization mode of the NVDRAM device shown in FIG. 3.

After the recall mode is carried out, the threshold voltage of the transistor in each memory cell is different because of datum stored in the floating gate 32. It is because the threshold voltage of the transistor is based on a datum, i.e., the logic HIGH datum or the logic LOW datum stored in the floating gate of the memory cell. Herein, the normalization mode is for setting up the threshold voltage of the transistor in all of the memory cells to the first threshold voltage $V_{Hth}$.

In first step, data stored in each capacitor Cap of all memory cells are backed up respectively.

Figure 5A:
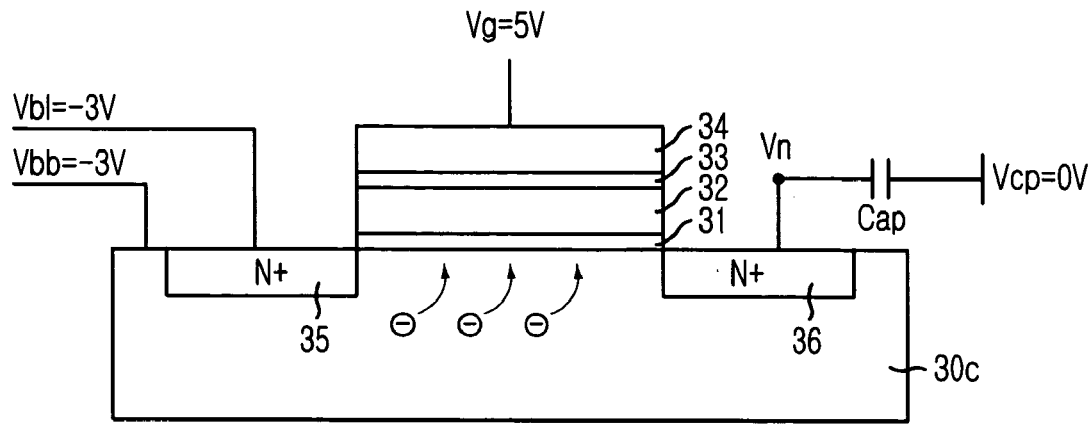
FIGS. 5A to 5D are cross-sectional views depicting a normalization mode of the NVDRAM device shown in FIG. 3.
Figure 5B:
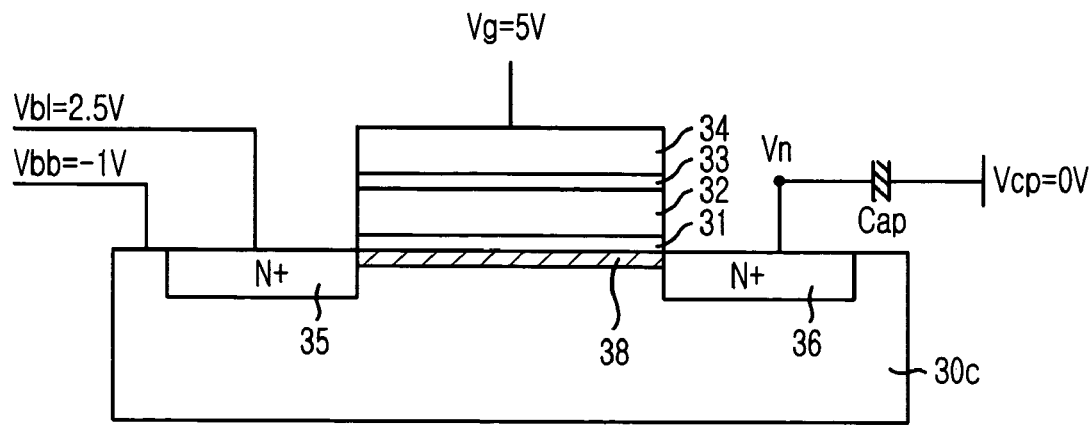

In second step, as shown in FIG. 5A, all of the word lines, i.e., gates of the transistors in all of the memory cells are supplied with above 5 V; and the bit lines and the bodies of all memory cells are supplied with about −3 V. Then, electrons under the second insulating layer 31 are moved to the floating gate 32. Thus, each memory cell has a threshold voltage, which turns on the transistor, higher than the first threshold voltage $V_{Hth}$.

In third step, the capacitors Caps of all the memory cells are charged by supplying the logic HIGH datum in all of the bit lines coupled to all of the memory cells when the gates of the transistors is supplied with about 5 V. Then, the capacitors Caps are charged with the logic HIGH datum.

In forth step, the threshold voltage of each memory cell is decreased to the first threshold voltage $V_{Hth}$, i.e., 1 V. In detail, the forth step includes the following steps: (a) removing electrons in the floating gate of the memory cells; (b) discharging the capacitor Cap by supplying gate of the transistor in the memory cells with the first threshold voltage $V_{Hth}$; and repeating the steps (a) and (b) until all of the capacitors Caps is discharged.

Figure 5C:
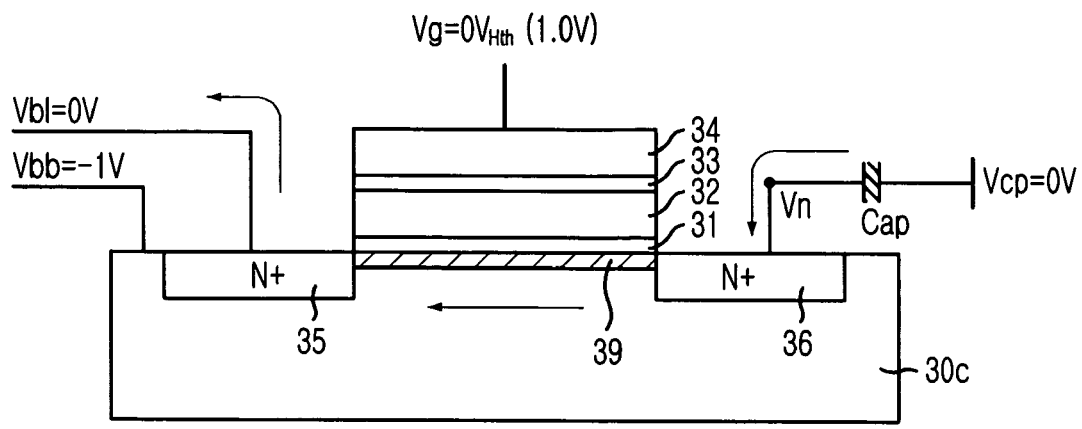
Figure 5C:
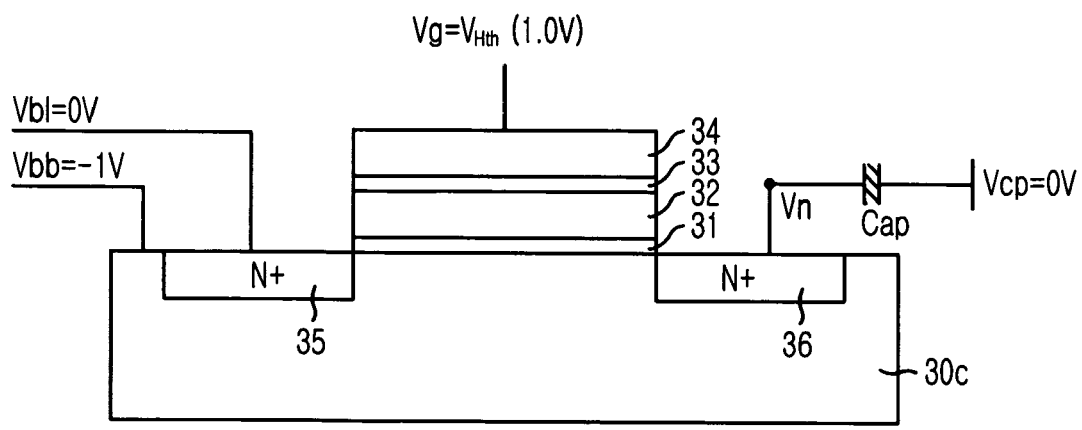

For instance, referring to FIG. 5C, the word line voltage is supplied with the first threshold voltage $V_{Hth}$, e.g., 1.0 V and the bit line is supplied with about 0 V. Then, if the threshold voltage of the memory cell is lower than the first threshold voltage $V_{Hth}$, the transistor of the memory cell is turned on and the capacitor Cap of the memory cell is discharged. However, if the threshold voltage is higher than the first threshold voltage $V_{Hth}$, the capacitor Cap is not discharged.

Figure 5D:
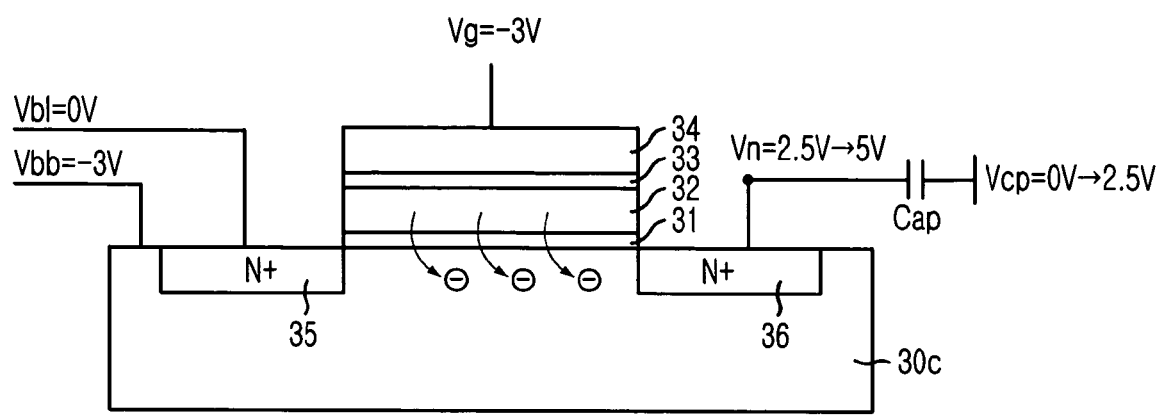

In the step (a) of the fifth step, referring to FIG. 5D, the word line is supplied with a negative voltage, e.g., −3 V; the bit line is supplied with 0 V; the bulk is supplied with −3 V; and the plate line of the capacitor Cap is supplied gradually from about 0 V to above about 2.5V. Herein, the capacitor Cap is a coupling capacitor, i.e., a voltage level of the one side is in response to a voltage level of the other side if the capacitor is not discharged and the voltage gap between sides of the capacitor is kept. Then, a voltage level of a storage node in a memory cell storing the logic HIGH data increases to about 5V and a storage node voltage of a memory cell storing the logic LOW data keeps about 2.5V. Herein, the storage node Vn is between the capacitor Cap and the transistor in the memory cell. As a result, a potential difference between the storage node and the control gate is about 8V. The potential difference is enough to delivers electrons stored in the floating gate 32 to the capacitor Cap. Then, the threshold voltage is gradually decreased until the threshold voltage is the first target threshold voltage $V_{Hth}$ (shown in FIG. 5D).

Thereafter, the gate of the transistor is supplied with the first threshold voltage $V_{Hth}$, i.e., 0 V. If the threshold voltage is decreased to the first threshold voltage $V_{Hth}$, the capacitor Cap is discharged; however, if not, the capacitor Cap is not discharged. If the capacitor Cap is not discharged, the gate of the transistor is supplied with the negative voltage, i.e., −3 V. Then, electrons stored in the floating gate 32 are moved to the capacitor Cap. In all of the memory cells, the process described above is repeated until the capacitor Cap is discharged.

Furthermore, all of the memory cells can be refreshed for clarifying the stored data, before the gate of the transistor is supplied with the negative voltage since the gate of the transistor is supplied with the first threshold voltage $V_{Hth}$.

In the other hand, the process is repeated because the capacitance of the capacitor Cap is not enough to receive the charges outputted from the floating gate. Herein, one cycle of the repeated process in the present invention is defined as a stress-refresh-check (SRC) process.

FIG. 5E is a graph demonstrating the normalization mode of the NVDRAM shown in FIG. 3.

In the SRC process, the third threshold voltage in the memory cell storing the logic LOW data converted from the logic HIGH data in the forth step is protected from being lower than the target threshold voltage because charges are not moved in the fifth step. This operation is defined as a threshold voltage clamping.

Finally, the back-up data are recovered into the original cells after the threshold voltage of the transistors in all of the memory cells is identical to the first threshold voltage $V_{Hth}$. Herein, the data converted by the recall mode can be turned back to the original by using an inverter when the data are backed up or recovered.

Meanwhile, in the NVDRAM device having the SONOS structure, charges are captured in not the whole nitride layer 32 but in sides of the nitride layer 32 closed to the source 35 and the drain 36. Herein, the charges captured in one side of the nitride layer 32 closed to the source 35 should be discharged. Thus, in the above described step, the word line is supplied with about −3 V and the bit line or the storage node is supplied with about 5 V.

Figure 6:
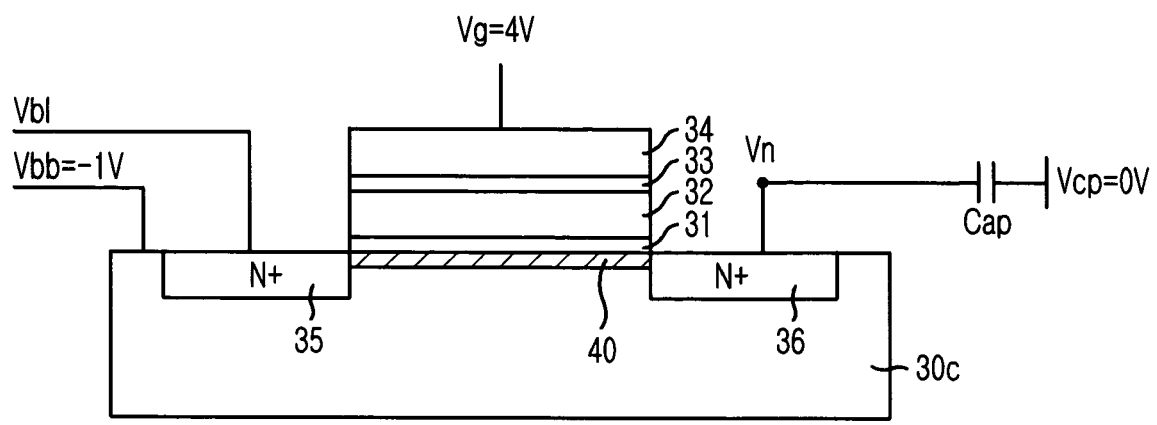
FIG. 6 is cross-sectional view depicting a normal DRAM mode of the NVDRAM shown in FIG. 3.

FIG. 6 is cross-sectional view depicting the normal DRAM mode of the NVDRAM device shown in FIG. 3.

In the normal DRAM mode, the NVDRAM device operates as a volatile DRAM, thus description about an operation of the normal DRAM mode is omitted.

Figure 7A:
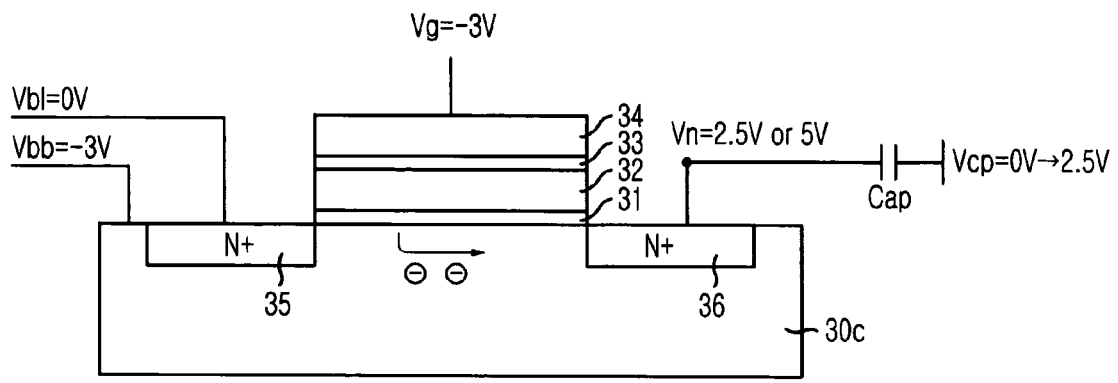
FIGS. 7A and 7B are cross-sectional views depicting a program mode of the NVDRAM shown in FIG. 3.
Figure 7B:
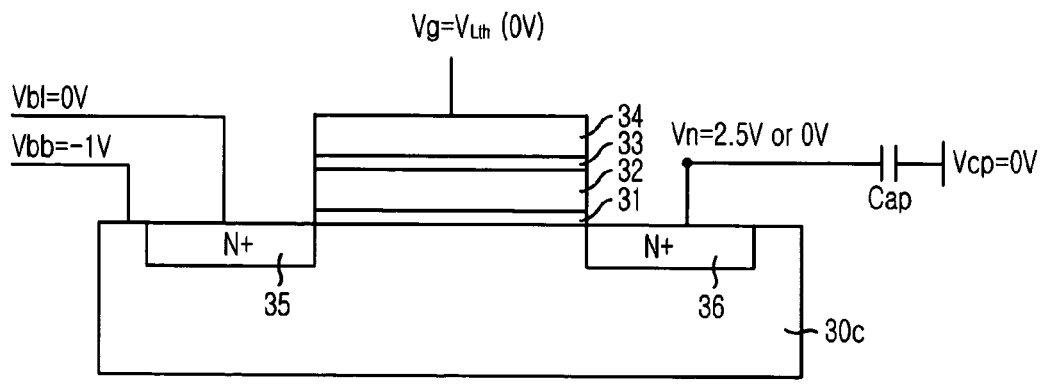

FIGS. 7A and 7B are cross-sectional views depicting a program mode of the NVDRAM shown in FIG. 3.

If the external voltage is unstable or isolated, the program mode for delivering data stored in the capacitor Cap to the floating gate 32 is performed.

In a first step, the plurality of memory cells is refreshed for clarifying stored data.

In a second step, in the memory cell storing the logic HIGH data, the threshold voltage is clamped to the second threshold voltage $V_{Lth}$. For the sake of this step, the word line is supplied with the second threshold voltage $V_{Lth}$, e.g., about 0 V and the bit line is supplied with about 0 V for a predetermined time. And the plate of the capacitor Cap is supplied with from about 0 V to about 2.5 V.

Thereafter, in a third step, in response to the data stored in the plurality of memory cells, the threshold voltage is decreased by selectively discharging charges in each floating gate 32 of the plurality of memory cells. As shown in FIG. 7A, the word line is supplied with about −3 V and the plate line of the capacitor Cap is increased from about 0 V to about 2.5 V. As a result, a voltage of the storage node of the memory cell storing the logic HIGH datum is about 5 V; and that of the storage node of the memory cell storing the logic LOW datum is about 2.5 V. Then, referring to FIG. 7C, in only memory cell storing the logic HIGH datum, charges captured in the floating gate 32 are discharged to the capacitor Cap, and, thus, the threshold voltage is decreased.

Finally, until all the memory cells store the logic LOW data, the second and third steps are sequentially repeated. This step is similar to the SRC of the normalization mode. As shown in FIG. 7C, after the NVDRAM device operates in the program mode, the threshold voltage of one memory cells storing the logic HIGH datum is changed to the second threshold voltage $V_{Lth}$ and the threshold voltage of the other memory cells storing the logic LOW datum is not changed, i.e., identical to the first threshold voltage $V_{Hth}$.

Figure 8:
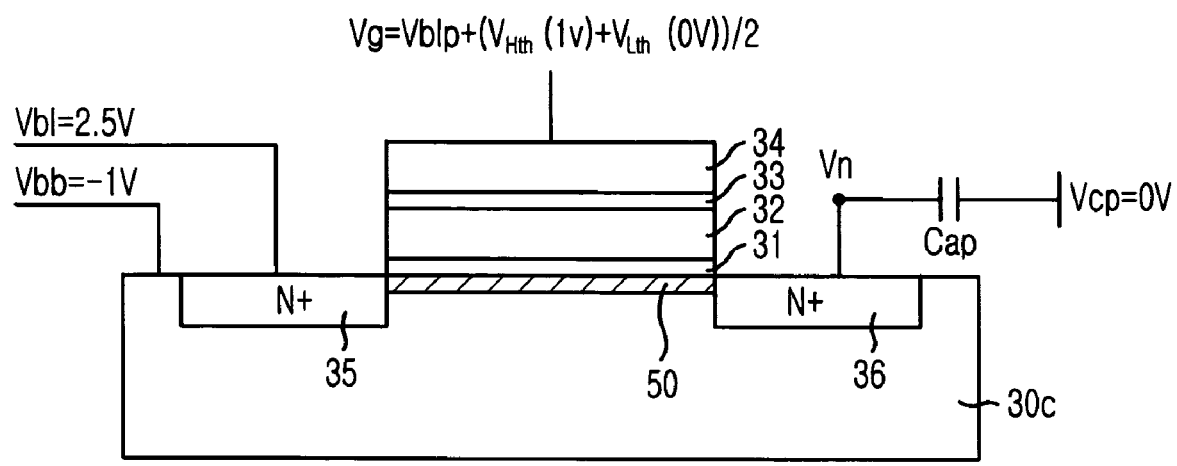
FIG. 8 is a cross-sectional view depicting a second example of the recall mode of the NVDRAM shown in FIG. 3.

FIG. 8 is a cross-sectional view depicting another example of the recall mode of the NVDRAM shown in FIG. 3.

In the recall mode, the data can be stored in the capacitor Cap without a data conversion.

First, one selected word line is supplied with a word line voltage derived by the following equation Eq-1.

$$V_{wl}=V_{blp}+(V_{Hth}+V_{Lth})/2 \quad [\text{Eq-1}]$$

Herein, '$V_{blp}$' is a bit line precharge voltage when the NVDRAM device operates as a volatile DRAM. '$V_{Hth}$' is the first threshold voltage of the memory cell having the logic LOW data when the NVDRAM operates in the program mode, and '$V_{Lth}$' is the target threshold voltage of the cell having the logic LOW data when the NVDRAM device operates in the program mode. In addition, other word lines except for the selected word line are supplied with a predetermined negative voltage in order to protect a voltage leakage between the capacitor Cap and the bit line.

Thereafter, the above process is performed in all the word lines of the cell block sequentially. As a result, each capacitor Cap can store the logic HIGH or LOW data by a potential difference between the first and second threshold voltages $V_{Hth}$ and $V_{Lth}$. The data stored in the capacitor Cap is defined as the following equation Eq-2.

$$V_{wl}=V_{blp}\pm(V_{Hth}-V_{Lth})/2 \quad [\text{Eq-2}]$$

Herein, the above denotations express the same in Eq-1.

Next, all of the memory cells are refreshed by supplying the word line with a higher voltage than the logic HIGH datum voltage. Then, a normal datum, i.e., the unconverted datum is stored in the capacitor Cap.

Figure 9:
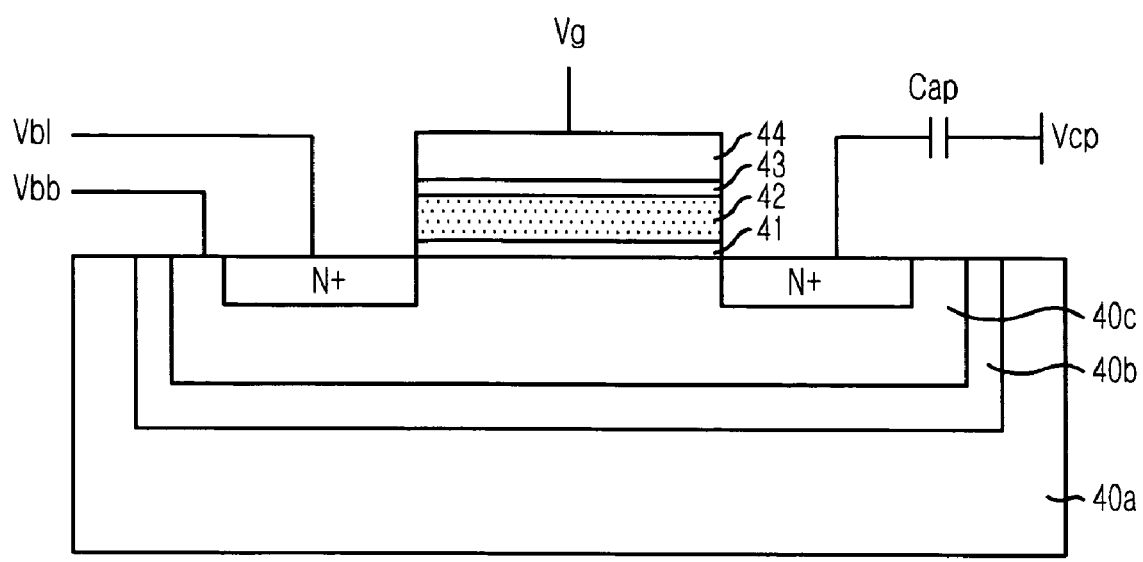
FIG. 9 is a cross-sectional view describing showing a dynamic cell in a NVDRAM device in accordance with another preferred embodiment of the present invention.

FIG. 9 is a cross-sectional view describing showing a dynamic cell in a NVDRAM device in accordance with another preferred embodiment of the present invention.

There is a memory cell of a NVDRAM device in accordance with another embodiment of the present invention. If a floating gate 32 is made of a nitride layer and a control gate 34 is made of a metal, a first insulating layer 33 is unnecessary. Hence, the memory cell can have a metal-nitride-oxide-silicon (MNOS) structure.

Consequently, on the basis of the above described preferred embodiments, the NVDRAM device can be controlled by supplying the word line, the bit line and the plate line of the capacitor in the memory cell with each different voltage. More particularly, because the plate line of the capacitor can be supplied with each different voltage in response to the operation mode of the NVDRAM device, the NVDRAM device can be operated by a relatively low internal voltage. As a result, the NVDRAM device can reduce power consumption dramatically.

While the present invention has been described with respect to the particular embodiments, it will be apparent to those skilled in the art that various changes and modifications may be made without departing from the spirit and scope of the invention as defined in the following claims.

What is claimed is:

1. A method for operating a non-volatile dynamic random access memory (NVDRAM) device including a plurality of memory cells, each cell having a capacitor and a transistor having a floating gate, comprising:
    preparing a power-on mode for performing a DRAM operation by controlling a threshold voltage of the transistor; and
    preparing a power-off mode for storing a data included in the capacitor into the floating gate,
    wherein the preparing the power-on mode includes:
    moving the data stored in the floating gate into the capacitor; and
    backing up the stored data in the capacitor before the controlling the threshold voltage of the transistor.

2. The method as recited in claim 1, wherein the moving the data includes:
    charging the capacitors of all memory cells with a logic HIGH datum; and
    discharging the capacitor in the memory cell having the transistor, its floating gate storing a logic high datum.

3. The method as recited in claim 2, wherein the moving the data includes refreshing the plurality of capacitors.

4. The method as recited in claim 3, wherein the plurality of the memory cells are arranged in a matrix by using a number of word lines and bit lines and the moving the data is carried out in a row-by-row basis.

5. The method as recited in claim 4, wherein the charging the capacitors includes:
    supplying one word line connected to a multiplicity of the memory cells with a first threshold voltage in order to turn on the transistors in all of the memory cells;
    writing the logic HIGH datum in the capacitors of the memory cells coupled to the word line; and
    repeating the charging the capacitors and discharging the capacitor in the memory cell having the transistor until all of the capacitors in the plurality of the memory cells are charged with the logic HIGH datum.

6. The method as recited in claim 2, wherein the discharging the capacitor in the memory cell having the transistor includes:

supplying all of the word lines with a second threshold voltage in order to turn on the transistors, its floating gate storing the logic HIGH datum; and supplying all of the bit lines with about 0 V in order to discharge the capacitors in the emory cell having the transistor, its floating gate storing the logic HIGH datum.

7. The method as recited in claim 1, wherein the controlling the threshold voltage includes:

supplying all gates of the transistors in all of the memory cells with a first predetermined voltage in order for fulfilling electrons in the floating gate;

charging all of the capacitors in all of the memory cells; and decreasing the threshold voltage of the transistors to the first threshold voltage.

8. The method as recited in claim 7, wherein the controlling the threshold voltage includes:

restoring the backup data in the capacitor after the decreasing the threshold voltage.

9. The method as recited in claim 8, wherein the charging all of the capacitors includes:

supplying one side of the capacitor with about 0 V; and supplying the bit line with the logic HIGH datum.

10. The method as recited in claim 9, wherein the decreasing the threshold voltage includes:

removing electrons in the floating gate of the memory cells;

discharging the capacitor by supplying the gate of the transistor in the memory cells with the first threshold voltage; and repeating the removing electrons and discharging the capacitor by supplying the gate until all of the capacitors are discharged.

11. The method as recited in claim 10, wherein the removing electrons includes:

supplying a gate of the transistor in all of the memory cells with a negative voltage;

supplying a plate of the capacitor in the memory cells with voltage level of a logic HIGH datum; and moving electrons in the floating gate to the capacitor storing the logic HIGH datum.

12. The method as recited in claim 11, wherein the moving electrons in the floating gate includes:

supplying the gate of the transistor with a second threshold voltage; and discharging the capacitor in some of the memory cells having the transistor turned on by the second threshold voltage.

13. The method as recited in claim 12, wherein the controlling_the threshold voltage includes the refreshing all of the memory cells.

14. The method as recited in claim 13, wherein the plurality of the memory cells are arranged in a matrix by using a number of word lines and bit lines and the adjusting the threshold voltage is carried out in a row-by-row basis.

15. The method as recited in claim 11, wherein the capacitor is a coupling capacitor.

16. The method as recited in claim 1, wherein the preparing the power-off includes:

removing electrons in the floating gate of the memory cell storing a logic HIGH datum;

discharging the capacitor by supplying gate of the transistor in all of the memory cells with a second threshold voltage; and repeating the removing electrons in the floating gate of the memory cell storing a logic HIGH datum and discharging the capacitor by supplying a gate of the transistor in all the memory cells with a second threshold voltage until all of the capacitors are discharged.

17. The method as recited in claim 16, wherein the removing electrons in the floating gate of the memory cell storing a logic HIGH datum includes:

supplying a gate of the transistor in all of the memory cells with a negative voltage;

supplying a plate of the capacitor in the memory cells with voltage level of a logic HIGH datum; and selectively moving electrons in the floating gate to the capacitor storing the logic HIGH datum.

18. The method as recited in claim 16, wherein the discharging the capacitor by supplying gate of the transistor in all of the memory cells with a second threshold voltage includes:

supplying the gate of the transistor with a second threshold voltage; and discharging the capacitor in some of the memory cells having the transistor turned on by the second threshold voltage.

19. The method as recited in claim 18, wherein the discharging the capacitor by supplying gate of the transistor in all of the memory cells with a second threshold voltage includes refreshing the memory cell.

20. The method as recited in claim 19, wherein the discharging the capacitor by supplying gate of the transistor in all of the memory cells with a second threshold voltage is carried out row-by-row.

21. The method as recited in claim 17, wherein the capacitor is a coupling capacitor.

22. The method as recited in claim 1, wherein the moving the data further includes:

supplying a word line with a voltage defined by the following equation:

$$V_{wl}=V_{blp}+(V_{th\text{-}H}+V_{th\text{-}L})/2$$

where $V_{blp}$ is a bit line precharge voltage, $V_{th\text{-}H}$ is a first threshold voltage, and $V_{th\text{-}L}$ is a second threshold voltage; and writing logic HIGH or LOW data in the capacitor in response to whether the threshold voltage is the $V_{th\text{-}H}$ or the $V_{th\text{-}L}$.

23. The method as recited in claim 22, wherein the moving the data includes refreshing the plurality of memory cells by supplying each word line with a voltage level being higher than the logic HIGH datum.

24. The method as recited in claim 23, wherein the moving the data is carried out row-by-row.

25. The method as recited in claim 24, wherein the supplying a word line further includes supplying other word lines with a predetermined negative voltage except for the word line supplied with the '$V_{wl}$'.

26. A non-volatile dynamic random access memory (NVDRAM) device including a plurality of memory cells in a matrix, each memory cell comprising:

a capacitor for storing a data; and a transistor for transmitting the data stored in the capacitor to a bit line, wherein the transistor includes a drain, a source, and a gate having a control gate and a floating gate for storing the data when a power is off and a threshold voltage of the transistor is controlled when the power is on, wherein one terminal of the capacitor is coupled to the drain of the transistor and another terminal of the capacitor is supplied with a controllable voltage determined according to an operation mode, and when preparing for power-on mode the data stored in the transistor is moved to the capacitor and captured data in the capacitor is backed up before the threshold voltage of the transistor is controlled.

27. The NVDRAM device recited in claim 26, wherein the floating gate of the transistor is made of nitride.

28. The NVDRAM device recited in claim 27, wherein the floating gate of the transistor formed in a single layer serves as a data storage.

29. A non-volatile dynamic random access memory (NVDRAM) including a plurality of memory cells in a matrix, wherein each memory cell includes:
 a control gate layer coupled to a word line;
 a capacitor for storing data; and a floating transistor for transmitting the stored data in the capacitor to a bit line and storing the data therein in response to an operation mode, wherein, when preparing for power-on mode, the data stored in the floating transistor is moved to the capacitor and the captured data in the capacitor is backed up before a threshold voltage of the floating transistor is controlled.

30. The NVDRAM device as recited in claim 29, wherein the control gate layer is made of metal and the gate of the floating transistor is made of nitride.

31. The NVDRAM recited in claim 30, wherein the gate of the floating transistor formed in a single layer serves as a data storage.

32. The NVDRAM recited in claim 30, wherein one terminal of the capacitor is coupled to a drain of the floating transistor and another terminal of the capacitor is supplied with a controllable voltage determined according to the operation mode.

* * * * *

UNITED STATES PATENT AND TRADEMARK OFFICE
CERTIFICATE OF CORRECTION

PATENT NO. : 7,099,181 B2 Page 1 of 1
APPLICATION NO. : 10/749297
DATED : August 29, 2006
INVENTOR(S) : Ahn et al.

It is certified that error appears in the above-identified patent and that said Letters Patent is hereby corrected as shown below:

Col. 9, line 5;
In Claim #6, Line 8, please delete "emory" and insert -- memory --.

Signed and Sealed this

Twenty-seventh Day of March, 2007

JON W. DUDAS
*Director of the United States Patent and Trademark Office*